(12) United States Patent
Bovati et al.

(10) Patent No.: US 6,291,141 B1
(45) Date of Patent: Sep. 18, 2001

(54) WASHING SOLVENT DESIGNED TO REMOVE THE UNPOLYMERISED PART OF A LAYER OF PHOTOPOLYMER EXPOSED TO LIGHT

(75) Inventors: Walter Bovati; Pier Angelo Balducci, both of Milan (IT)

(73) Assignee: Chimeko S.r.l. Trade Chimico Ecologico, Milan (IT)

( * ) Notice: Subject to any disclaimer, the term of this patent is extended or adjusted under 35 U.S.C. 154(b) by 0 days.

(21) Appl. No.: 09/535,199

(22) Filed: Mar. 27, 2000

(30) Foreign Application Priority Data

Jun. 21, 1999 (IT) .............................................. MI99A1378

(51) Int. Cl.$^7$ ....................................................... G03F 7/32
(52) U.S. Cl. ............................................................ 430/331
(58) Field of Search ............................................... 430/331

(56) References Cited

U.S. PATENT DOCUMENTS 5,061,606 * 10/1991 Telser et al. ......................... 430/331

* cited by examiner

*Primary Examiner*—Hoa Van Le
(74) *Attorney, Agent, or Firm*—Hedman & Costigan, P.C.

(57) ABSTRACT

This invention relates to a washing solvent designed to remove the unpolymerised part of a photopolymer exposed to light, in particular in flexographic printing processes, characterised in that the said solvent comprises 25 to 70% in weight of an alicyclic hydrocarbon, 15 to 50% in weight of an aromatic hydrocarbon and 10 to 30% in weight of an aliphatic alcohol.

12 Claims, No Drawings

WASHING SOLVENT DESIGNED TO REMOVE THE UNPOLYMERISED PART OF A LAYER OF PHOTOPOLYMER EXPOSED TO LIGHT

The invention relates to a washing solvent for layers of photopolymer which are cured (crosslinked) by exposure to light.

The said photopolymers are used to print various plates, preferably using the flexographic printing technique. They are basically elastomers which contain polymerisation photoinitiators.

In order to produce these printing plates, in particular those used for flexographic printing, the photopolymers are exposed to actinic light. The part of the photopolymer required to be in relief is polymerised by passing it under actinic light. The unpolymerised part of the photopolymer can then be washed out with a washing solvent which dissolves and removes it, thus leaving the part of the photopolymer which has been polymerised and hardened by the light in relief.

The washing solvent should dissolve the unpolymerised layer of photopolymer as rapidly as possible. The solvent should then evaporate from the body of the photopolymer so that it is thoroughly dry.

It is fairly easy to obtain this performance with highly volatile solvents such as methyl ethyl ketone, benzene, toluene, trichloroethane, trichloroethylene, tetrachloroethane, etc.

The unacceptable disadvantage involved in the use of these solvents is that they are hazardous, and their use and disposal consequently creates serious problems of health, safety and environmental protection.

These solvents also have a very strong, unpleasant, pungent odour, which remains incorporated in the printing plates.

The object of this invention is to produce a washing solvent of the kind described above which possesses the following characteristics: not toxic or hazardous; a high flash point; a very faint odour; a fast washing speed and a fast drying speed in the oven; no disposal problems, recoverable and recyclable.

In order to achieve these objectives, and the other advantages which will be described below, this invention offers a washing solvent designed to remove the unpolymerised part of a photopolymer exposed to light, in particular in flexographic printing processes, characterised in that the said solvent comprises 25 to 70% in weight of an alicyclic hydrocarbon, 15 to 50% in weight of an aromatic hydrocarbon and 10 to 30% in weight of an aliphatic alcohol.

In accordance with the invention, the said alicyclic hydrocarbon is preferably chosen from among the terpenes with the formula C10 H16, of both dextro- and laevo-isomeric forms, and in the racemic form dipentene.

The said aromatic hydrocarbon is preferably a mixture of aromatic hydrocarbons with the formula C10.1 H14.3.

The said aliphatic alcohol is chosen from among the high-boiling aliphatic alcohols with the formula C7 H16.0, C8 H18.0.

With reference to the proportions of the constituents in the solvent according to the invention, the following examples are given, by way of example but not of limitation, in which the various concentrations are expressed as percentages in weight of the total solvent weight.

EXAMPLE 1

Alicyclic hydrocarbon 70%
aromatic hydrocarbon 20%
aliphatic alcohol 10%

EXAMPLE 2

Alicyclic hydrocarbon 40%
aromatic hydrocarbon 40%
aliphatic alcohol 20%

EXAMPLE 3

Alicyclic hydrocarbon 25%
aromatic hydrocarbon 50%
aliphatic alcohol 25%

EXAMPLE 4

Alicyclic hydrocarbon 35%
aromatic hydrocarbon 50%
aliphatic alcohol 15%

EXAMPLE 5

Alicyclic hydrocarbon 50%
aromatic hydrocarbon 30%
aliphatic alcohol 20%

EXAMPLE 6

Alicyclic hydrocarbon 60%
aromatic hydrocarbon 15%
aliphatic alcohol 25%

EXAMPLE 7

Alicyclic hydrocarbon 54%
aromatic hydrocarbon 16%
aliphatic alcohol 30%

EXAMPLE 8

Alicyclic hydrocarbon 45%
aromatic hydrocarbon 35%
aliphatic alcohol 20%

EXAMPLE 9

Alicyclic hydrocarbon 35%
aromatic hydrocarbon 50%
aliphatic alcohol 15%.

As the preferred solvent in accordance with this invention, we propose in particular the one comprising 45% alicyclic hydrocarbon, 35% aromatic hydrocarbon and 20% aliphatic alcohol. These percentages are once again expressed in weight to the total solvent weight.

We will now describe some further examples of the invention, with particular reference to the advantages obtainable.

The next example, no. 10, relates to a comparison solvent made in accordance with the known technique.

EXAMPLE 10

A three-layer (styrene—isoprene—styrene) photopolymer for flexographic printing with a total thickness of 2.84 mm was totally exposed to light:

| | |
|---|---|
| exposure of back = | 90 seconds |
| exposure of front = | 12 minutes. |

Using a washing machine equipped with brushes, the photopolymer was washed with a known solvent having the following composition:

71% in weight of aromatic hydrocarbons

29% in weight of aliphatic alcohols.

After washing, the photopolymer was placed in a forced-ventilation oven at the temperature of 62° C. until the solvent had completely evaporated.

The following operating conditions were applied:

washing: 10 minutes drying: 150 minutes.

The following results were obtained:

| | |
|---|---|
| thickness of photopolymer basel. | 90 mm |
| thickness of photopolymer relief | 0.94 mm |
| total photopolymer thickness | 2.84 mm | quality of photopolymer obtained good odour of solvent during processing:strong, unpleasant and impregnating odour of finished photopolymer: unpleasant and pungent.

EXAMPLE 11

The same type of photopolymer as in example 10 was exposed as described in example 10 and processed with the same washing machine, with the difference that the following solvent in accordance with the invention was used:

| | |
|---|---|
| alicyclic hydrocarbon | 45.0% in weight |
| mixture of aromatic hydrocarbons | 35.0% in weight |
| high-boiling aliphatic alcohols | 20.0% in weight. |

After the photopolymer had been processed as described in example 10, the drying time in the oven was reduced from 150 to 50 minutes, and the following results were obtained:

| | |
|---|---|
| thickness of photopolymer base | 1.80 mm |
| thickness of photopolymer relief | 1.04 mm |
| total photopolymer thickness | 2.84 mm | quality of photopolymer obtained excellent odour of solvent during processing:good (slight citrus fruit odour)

odour of finished photopolymer: slight citrus fruit odour.

On the basis of these results, it can be observed in general that the solvent in accordance with the invention has a far less aggressive odour than known solvents, does not irritate the eyes, even at a very close distance, and has a mild, pleasant citrus fruit scent.

In addition, the workplace is healthier for production workers.

When the solvent in accordance with the invention is used, washing time is reduced by over 40% compared with known solvents.

In addition, over 40% more photopolymer plates can be produced in the same production time.

Moreover, in view of the formulation of the solvent in accordance with the invention, solvent consumption is 20% less than with known solvents.

Taking normal consumption as 10 litres per mm of etching depth per m2 of photopolymer production, the said consumption will be only 8.0 litres per mm when the solvent in accordance with the invention is used.

During the washing stage, the photopolymer plates absorb a minimal quantity of solvent, and their thickness is increased by some 10–11 hundredths.

The time taken to dry a photopolymer plate completely in an oven at 62° C. is only 40–50 minutes, compared with a drying time of 150–180 minutes when known solvents are used.

After this shorter time, the solvent in accordance with the invention has totally evaporated, reducing the thickness of the hot photopolymer by approx. 4–6 hundredths.

When the plate is removed from the oven and cooled, it returns to the nominal thickness ±3 hundredths.

Example: nominal photopolymer thickness=2.84 mm actual thickness of photopolymer before washing=2.82 mm thickness of photopolymer after washing=2.92 mm thickness of photopolymer after 45 minutes in the oven= 2.87 mm thickness of photopolymer after 25 minutes' cooling=2.84 mm.

Moreover, the printing area of the photopolymer, namely the part in relief, is not tacky, even immediately after washing.

Finally, when the solvent in accordance with the invention is used, the normal finishing time can be reduced by 25% as the tackiness of the polymer has been eliminated.

As will be seen from the above description, the solvent in accordance with the invention effectively achieves all the aims described above.

What is claimed is:

1. Washing solvent designed to remove the unpolymerised part of a photopolymer exposed to light, in particular in flexographic printing processes, characterised in that the said solvent comprises 25 to 70% in weight of an alicyclic hydrocarbon, 15 to 50% in weight of an aromatic hydrocarbon and 10 to 30% in weight of an aliphatic alcohol.

2. Solvent as claimed in claim 1, characterised in that the said alicyclic hydrocarbon is chosen from among the terpenes with the formula $C_{10}H_{16}$, of both dextro- and laevo-isomeric forms, and in the racemic form dipentene, the said aromatic hydrocarbon is a mixture of aromatic hydrocarbons with the formula $C_{10.1}H_{14.3}$, and the said aliphatic alcohol is chosen from among the high-boiling aliphatic alcohols with the formula $C_7H_{16.0}$, $C_8H_{18.0}$.

3. Solvent as claimed in claim 1, characterised in that the said solvent comprises 70% in weight of alicyclic hydrocarbon, 20% in weight of aromatic hydrocarbon and 10% in weight of aliphatic alcohol.

4. Solvent as claimed in claim 1, characterised in that the said solvent comprises 40% in weight of alicyclic hydrocarbon, 40% in weight of aromatic hydrocarbon and 20% in weight of aliphatic alcohol.

5. Solvent as claimed in claim 1, characterised in that the said solvent comprises 25% in weight of alicyclic hydrocarbon, 50% in weight of aromatic hydrocarbon and 25% in weight of aliphatic alcohol.

6. Solvent as claimed in claim 1, characterised in that the said solvent comprises 35% in weight of alicyclic hydrocarbon, 50% in weight of aromatic hydrocarbon and 15% in weight of aliphatic alcohol.

7. Solvent as claimed in claim 1, characterised in that the said solvent comprises 50% in weight of alicyclic hydrocarbon, 30% in weight of aromatic hydrocarbon and 20% in weight of aliphatic alcohol.

8. Solvent as claimed in claim 1, characterised in that the said solvent comprises 60% in weight of alicyclic hydrocarbon, 15% in weight of aromatic hydrocarbon and 25% in weight of aliphatic alcohol.

9. Solvent as claimed in claim 1, characterised in that the said solvent comprises 54% in weight of alicyclic hydrocarbon, 16% in weight of aromatic hydrocarbon and 30% in weight of aliphatic alcohol.

10. Solvent as claimed in claim 1, characterised in that the said solvent comprises 45% in weight of alicyclic hydrocarbon, 35% in weight of aromatic hydrocarbon and 20% in weight of aliphatic alcohol.

11. Solvent as claimed in claim 1, characterised in that the said solvent comprises 35% in weight of alicyclic hydrocarbon, 50% in weight of aromatic hydrocarbon and 15% in weight of aliphatic alcohol.

12. Solvent as claimed in claim 1, characterised in that the said solvent comprises 45% in weight of alicyclic hydrocarbon, 35% in weight of aromatic hydrocarbon and 20% in weight of aliphatic alcohol.

* * * * *